United States Patent [19]

Nguyen et al.

[11] Patent Number: 5,576,642
[45] Date of Patent: *Nov. 19, 1996

[54] ELECTRONIC SYSTEM INCLUDING HIGH PERFORMANCE BACKPLANE DRIVER/RECEIVER CIRCUITS

[75] Inventors: Trung Nguyen, San Jose; Anthony Y. Wong, Saratoga, both of Calif.

[73] Assignee: LSI Logic Corporation, Milpitas, Calif.

[ * ] Notice: The term of this patent shall not extend beyond the expiration date of Pat. No. 5,408,146.

[21] Appl. No.: 422,844

[22] Filed: Apr. 17, 1995

Related U.S. Application Data

[63] Continuation-in-part of Ser. No. 828,404, Jan. 31, 1992, Pat. No. 5,408,146.
[51] Int. Cl.$^6$ .................. H03K 19/0185; H03K 19/0948
[52] U.S. Cl. ............................ 326/86; 326/30; 326/83; 326/115; 326/101; 327/53
[58] Field of Search .................. 326/30, 86, 82–83, 326/101, 114–115, 112, 119, 121; 327/53

[56] References Cited

U.S. PATENT DOCUMENTS

| | | | |
|---|---|---|---|
| 4,658,157 | 4/1987 | McGowan | 326/66 |
| 4,739,193 | 4/1988 | Doty, II | 326/83 |
| 4,937,476 | 6/1990 | Bazes | 326/71 |
| 5,023,488 | 6/1991 | Gunning | 326/86 |
| 5,038,058 | 8/1991 | Wang | 326/84 |
| 5,047,671 | 9/1991 | Suthar et al. | 326/30 |
| 5,148,056 | 9/1992 | Glass et al. | 326/86 |
| 5,408,146 | 4/1995 | Nguyen et al. | 326/87 |

OTHER PUBLICATIONS

Gunning et al. JEDEC; *GTL: A Low Voltage Swing Transmission Line Transceiver.* Mar. 15, 1991.

Chen, John Y. *CMOS Devices and Technology for VLSI.* Prentice Hall, 1990. pp. 312–317.

Weste et al. *Principles of CMOS VLSI Design.* Addison-Wesley, 1985. pp. 58–60, 109.

Nguyen et al. "A High Performance, Low Noise, Low Power, Backplane Driver Using 0.7 μm BiCMOS Technology." May 19, 1990.

*Primary Examiner*—Edward P. Westin
*Assistant Examiner*—Jon Santamauro
*Attorney, Agent, or Firm*—Poms, Smith, Lande & Rose

[57] ABSTRACT

An electronic system such as a Single-Chip-Module (SCM), a Multi-Chip-Module (MCM), or a Board-Level-Product (BLP) includes a plurality of units which are interconnected by a terminated transmission bus line. Each unit includes a CMOS circuit, a terminated bus line for signal transmission, and a driver/receiver circuit which is spaced from the CMOS circuit on a substrate. A guard ring is formed around at least a part of the CMOS circuit which faces the driver/receiver circuit. The driver/receiver circuit includes a driver for receiving an input logic signal from the CMOS circuit and inducing a corresponding signal onto the bus line, and a receiver for receiving an output signal from the bus line and providing a corresponding output logic signal to the CMOS circuit. The receiver includes a receiver transistor having a gate electrically connected to the bus line and producing a current in relation to the received signal, a comparator for comparing a voltage level of the received signal to a reference voltage level and for splitting the current into a first path having a current inversely proportional to the received signal and a second path having a current in proportion to the received signal, an output section for providing the CMOS logic signal at a first logic state when the current in the first path is greater than the current in the second path, and for providing the CMOS logic signal at a second logic state when the current in the first path is less than the current in the second path.

22 Claims, 3 Drawing Sheets

ELECTRONIC SYSTEM INCLUDING HIGH PERFORMANCE BACKPLANE DRIVER/RECEIVER CIRCUITS

CROSS-REFERENCE TO RELATED APPLICATION

This application is a continuation-in-part of U.S. patent application Ser. No. 07/828,404, filed Jan. 31, 1992, entitled "HIGH PERFORMANCE BACKPLANE DRIVER CIRCUIT" by Trung Nguyen et al, now U.S. Pat. No. 5,408,146, issued Apr. 18, 1995.

BACKGROUND OF THE INVENTION

1. Field of the Invention

The present invention generally relates to system level electronic devices, and more particularly to an electronic system including high performance backplane driver/receivers for interfacing Complimentary-Metal-Oxide-Semiconductor (CMOS) circuits to low impedance terminated transmission bus lines.

2. Description of the Related Art

The advent of digital computers and the like has enabled numerous circuits to be interconnected for binary communication over single segment or multi-segment transmission lines. These transmission lines, collectively known as backplane busses are often provided in the form of long traces on the backplane of a printed circuit board.

A typical backplane data bus includes a transmission line with its opposite ends terminated to a regulated voltage through termination resistors. The circuits are provided on cards, which communicate with the bus through connectors provided along the trace.

Each of the circuits is typically provided with drivers, which receive logic signals from internal components of the circuits and are capable of delivering a predetermined voltage signal to the bus. Receivers are also provided, which are capable of receiving the voltage signals on the bus produced by the drivers and converting them to logic signals for the internal components.

A significant problem with the backplane data bus is that as the circuits with their associated drivers are added to the bus, the impedance of the bus drops significantly.

A typical bus backplane has an unloaded characteristic impedance of about 1000 ohms. The capacitative loading of each external circuit which is added to the bus decreases the overall impedance of the bus. It is not uncommon for a fully loaded bus to have an impedance level between 200 to 300 ohms. This lower impedance requires the drivers to produce more drive current in order to maintain the appropriate signal voltage level on the bus.

For example, Transistor-Transistor Logic (TTL) components require voltage level swings of 3 to 5 volts in order to register changes in logic state. A typical driver using TTL components has a 50 milliamperes output current rating, which is sufficient to pull down a 1000 ohm load connected to 5 volts.

However, when the load has been reduced to 200 ohms, as in a fully loaded bus, the driver current requirement jumps to 250 milliamperes. This current requirement is clearly beyond the limits of a TTL component, and would quickly burn out the driver.

Simply increasing the power output capability of the driver only makes the problem worse. Output drivers which are capable of providing the higher current also increase the capacitative loading on the bus. Thus, as the driver power is increased, the requirement for greater power also increases, resulting in a never ending cycle, and which also fails to solve the initial problem.

Additionally, the high power drivers also suffer from greater noise and cross-talk, along with greater power consumption, rendering them undesirable as a solution to the backplane driver problem.

A proposed solution to the backplane driver problem was provided in the prior art by a driver developed by National Semiconductor Corporation. The prior art driver uses Backplane Transistor Logic (BTL) technology, which provides signal level swings between 1.1 and 2 volts.

The driver circuit, designated as 20 in FIG. 1, provides a Schottky diode 24 connected between the bus and the collector of a Schottky transistor 22. The emitter of the transistor 22 is connected to ground, and the base receives the input voltage.

A nominal high voltage level (i.e., logical "one" level) applied to the base causes the transistor 22 to conduct and provides a voltage differential across the diode 24, which consequently drops the signal on the transmission line to the nominal low level. Conversely, a nominal low voltage signal (i.e., logical "zero" level) prevents the transistor 22 from conducting, which cuts off the flow of current through the diode 24.

It should be apparent that when the driver 20 is not conducting, the maximum capacitance seen from the bus is limited to that of the reversed biased Schottky diode 24. The reduced capacitative loading maintains the bus impedance at close to the unloaded level and keeps the current requirement for the driver at a manageable level.

However, a problem with the prior art driver is its incompatibility with the TTL or CMOS components typically used in external circuits. The differing kinds of components cannot be provided on a single integrated circuit since the components require different materials. The use of different component types also adds complexity to the circuit, and decreases the amount of available board space on the external circuit boards.

An additional problem with the BTL driver, as well as with other types of prior art drivers, is that of heat dissipation. The voltage swing which the driver must provide is directly related to the power which must be dissipated by the driver.

The power is dissipated internally in the form of heat which must ultimately be removed from the circuit to prevent the circuit from overheating which can damage adjacent components on the circuit board. To reduce the heat dissipation requirement, it is necessary to minimize the driver's voltage swing requirement.

The use of CMOS technology is quite popular in the art, since CMOS circuits can be formed to relatively high gate densities. CMOS transistors configured with the drain directly connected to the bus would introduce very low capacitative load, and thus would be desirable for use in a backplane driver.

However, CMOS circuits require a nominal 5 volt voltage swing, which would be unacceptably high due to the power dissipation problem discussed above. In addition, the speed of the logic level changes in typical CMOS circuits would produce noise on the ground bus and on the backplane data bus.

Therefore, it would be desirable to provide a backplane driver which would introduce relatively low capacitative load to a terminated transmission line. It would be further desirable to provide a backplane driver utilizing relatively low voltage swings to minimize power dissipation. It is still further desirable to provide a backplane driver which could be implemented in existing CMOS technology for interfacing with CMOS circuits.

SUMMARY OF THE INVENTION

In accordance with the present invention, an electronic system such as a Single-Chip-Module (SCM), a Multi-Chip-Module (MCM), or a Board-Level-Product (BLP) includes a plurality of units which are interconnected by a terminated transmission bus line.

Each unit includes a CMOS circuit, a terminated bus line for signal transmission, and a driver/receiver circuit which is spaced from the CMOS circuit on a substrate. A guard ring is formed around at least a part of the CMOS circuit which faces the driver/receiver circuit.

The driver/receiver circuit includes a driver for receiving an input logic signal from the CMOS circuit and inducing a corresponding signal onto the bus line, and a receiver for receiving an output signal from the bus line and providing a corresponding output logic signal to the CMOS circuit.

The receiver includes a receiver transistor having a gate electrically connected to the bus line and producing a current in relation to the received signal, a comparator for comparing a voltage level of the received signal to a reference voltage level and for splitting the current into a first path having a current inversely proportional to the received signal and a second path having a current in proportion to the received signal, an output section for providing the CMOS logic signal at a first logic state when the current in the first path is greater than the current in the second path, and for providing the CMOS logic signal at a second logic state when the current in the first path is less than the current in the second path.

Accordingly, a principal object of the present invention is to provide a backplane driver/receiver for use in system level applications which introduces relatively low capacitive load to a terminated transmission line.

Another object of the present invention is to provide a backplane driver/receiver utilizing relatively low voltage swings to minimize power dissipation.

Still another object of the present invention is to provide a backplane driver/receiver which could be implemented in existing CMOS technology for interfacing with CMOS circuits.

A more complete understanding of the present high performance backplane driver/receiver circuit and system level applications incorporating the driver/receiver will be afforded to those skilled in the art, as well as a realization of additional advantages and objects thereof, by a consideration of the following detailed description of the preferred embodiments. Reference will be made to the appended sheets of drawings which will be first described briefly.

DETAILED DESCRIPTION OF THE INVENTION

The present invention provides an electronic system level device including a plurality of units which are interconnected by a terminated transmission bus line.

A system level device may specifically include Single-Chip-Modules (SCM), often including other electrical components (such as capacitors); Multi-Chip-Modules (MCM) having 2 or more integrated circuits with or without other electrical components; and board level products (BLP), such as those having multiple integrated circuits on a resin printed circuit or substrate board.

The invention further includes box level products ("Boxes"), which may include a combination of elements from the list of SCM, MCM, BLP, or other devices, and may also include a power supply.

Such system level devices specifically contemplated include digital (or other) memory storage systems, security systems, general purpose computers (such as personal computers, work stations, servers, mini computers, mainframe computers and super computers), transportation vehicles (such as airplanes, trains, automobiles, helicopters, rockets, missiles, boats, and submarines).

The contemplated system level devices further include subsystems for such vehicles, such as positioning (i.e. Global Positioning Systems (GPS)), display controllers, navigation, etc., entertainment systems (such as digital or other television, cameras, recorders, compact disc players/recorders, FM, AM, tape or other audio systems), communication systems such as "traditional" or cellular telephones, PBX, telephone switches, network controllers or encoder/decoders (i.e. token ring, Ethernet, etc.).

The contemplated devices yet further include subsystems or subassemblies for inclusion or attachment to such more complex system level products.

The intended applications for the present invention include a plurality of CMOS elements which are interconnected by terminated backplane transmission bus lines, and require driver/receivers for interfacing CMOS circuits to the bus lines.

A backplane bus common to digital computers and the like enables numerous circuits to be interconnected for binary communication. Each of the circuits are provided with drivers capable of delivering a predetermined voltage signal to the bus, and receivers capable of receiving the voltage signals on the bus produced by the drivers.

There is a critical need to provide CMOS compatible drivers and receivers which can provide low voltage logic swings while not increasing the capacitive load of the backplane bus.

Figure 1:
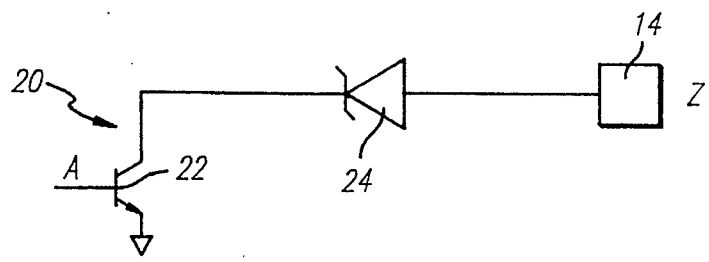
FIG. 1 is a schematic diagram of a prior art BTL driver.
Figure 2:
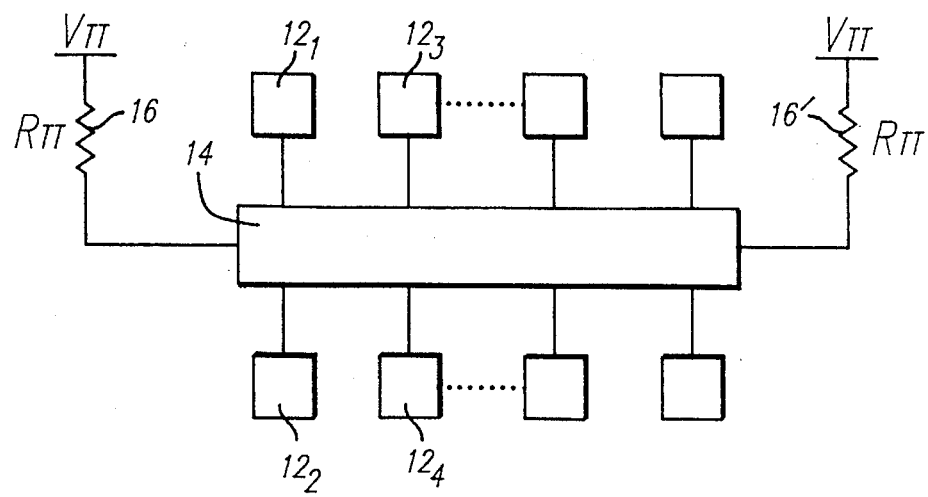
FIG. 2 is a block diagram of a backplane bus system.

Referring first to FIG. 2, a basic backplane bus which is generally designated as 10 comprises a bus or transmission line 14, and has termination resistors 16 and 16' connected in series with opposite ends of the transmission line. A voltage source, $V_{TT}$, is applied to the opposite ends of the termination resistors 16, 16'.

As shown, a plurality of CMOS circuits 12 are connected to the transmission line 14 for binary communication between the circuits. As is well known in the art, the bus 10 may comprise one of several similar buses which are formed together on the backplane of a printed circuit board, which forms a multiple bit bus. Such a multiple bit bus is typically used to transmit multiple bit data, such as for a 16 bit or 32 bit wide data stream.

In accordance with the present invention, each of the circuits 12 is provided with a backplane driver/receiver including a backplane driver 30 which will be described in detail below with reference to FIGS. 6 and 7. The driver 30 is capable of placing a signal on the bus 10 representing either a high ("1") or a low ("0") logic level, which can be received by an associated receiver circuit 50, as will be described below with reference to FIG. 8.

Figure 3:
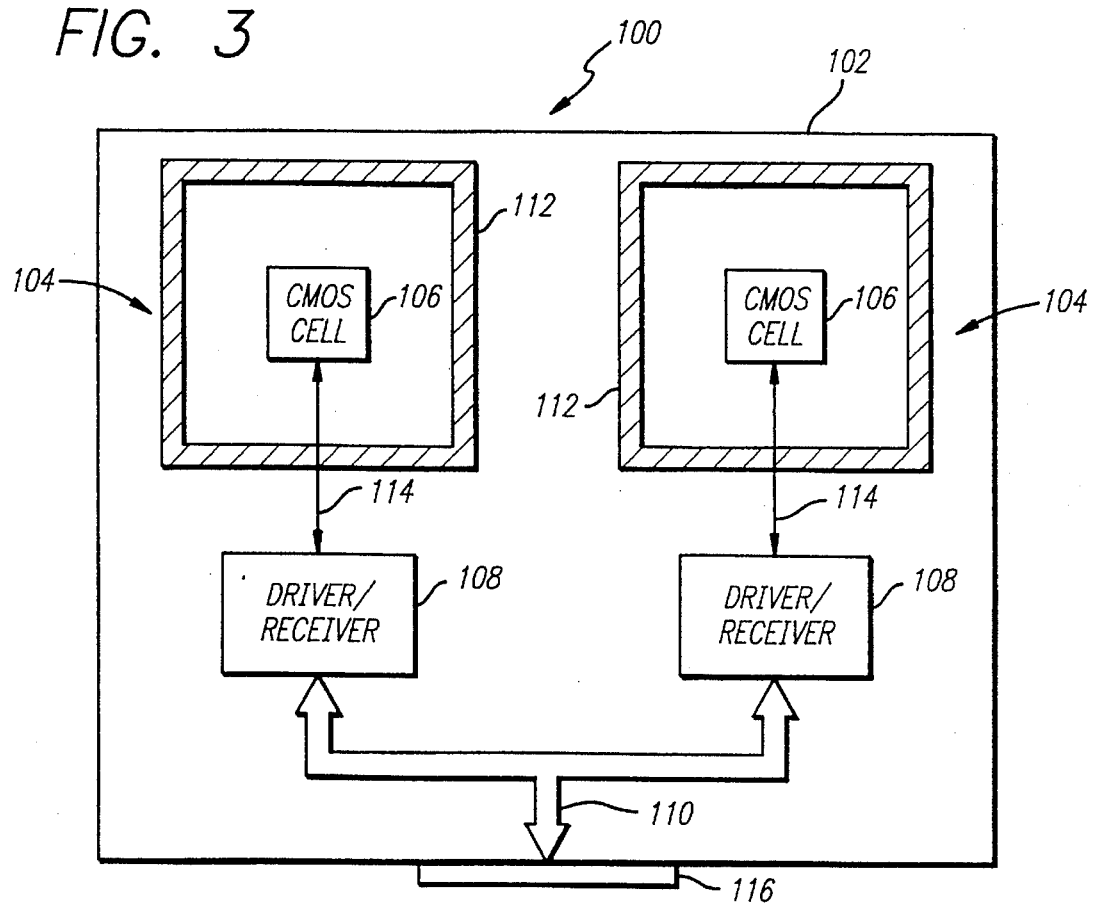
FIG. 3 is a diagram illustrating a Single-Chip-Module (SCM) incorporating backplane driver/receivers according to the present invention.

A first system level application of the present invention is illustrated in FIG. 3 in the form of a Single-Chip-Module (SCM) 100. The module 100 may be an Application Specific Integrated Circuit (ASIC) or an integrated circuit logic gate array, although the invention is not limited to any particular type of integrated circuit.

The SCM 100 comprises a semiconductor substrate 102 on which are formed a plurality of CMOS circuit units 104. Each unit 104 includes a CMOS circuit cell 106 which, although not explicitly illustrated, includes a number of individual transistors, capacitors, resistors, and other microelectronic circuit elements.

The cells 106 are connected to respective driver/receiver circuits 108 of the present invention which act as interfaces between the cells 106 and a terminated backplane transmission bus line 110 as described above with reference to FIG. 2. The line 110 is provided with an external connector 116 for connecting the SCM 100 to other electronic components.

As will be described in detail below, a guard ring 112 is formed around each cell 106 on the substrate 102, or at least around the portion of each cell 106 which faces the respective driver/receiver 108. The purpose of the guard rings 112 is to provide electromagnetic isolation or shielding between the cells 106 and driver/receivers 108 so that they communicate with each other only through interconnecting signal lines 114.

The guard rings 112 are formed by impurity diffusion doping of the substrate 102 in the requisite areas. The dopant type can be "majority" (same conductivity or carrier type as the cells 104) or "minority" (opposite conductivity or carrier type). The particular configuration of the guard rings 112 is not the particular subject matter of the present invention. It is only necessary that the guard rings 112 reduce electromagnetic communication between the cells 104 and driver/receivers 108 except through the lines 114 to an acceptable level.

Hybrid or Multi-Chip Modules (MCM) provide reduced size and increased system level performance. An MCM includes a substrate on which one or more integrated circuit chips are mounted. The substrate has a multilevel structure including alternating patterned metal conductor and dielectric layers.

The conductors layers are formed by thin film screen printing, sputtering or plating, and are patterned as lines and planes to provide power and signal interconnections between chips. Vertical interconnects (vias) are formed through the dielectric layers to appropriately interconnect adjacent conductor layers. The dielectric layers are typically formed by deposition of polyimide.

Interconnections between the chips and the conductors on the substrate can be made by wire bonds or the like in a configuration in which the chips are mounted on the substrate with their terminals facing away from the substrate, or by conductive bumps in a configuration known as "flip-chip" in which the chips are mounted with their terminals facing the substrate.

Figure 4:
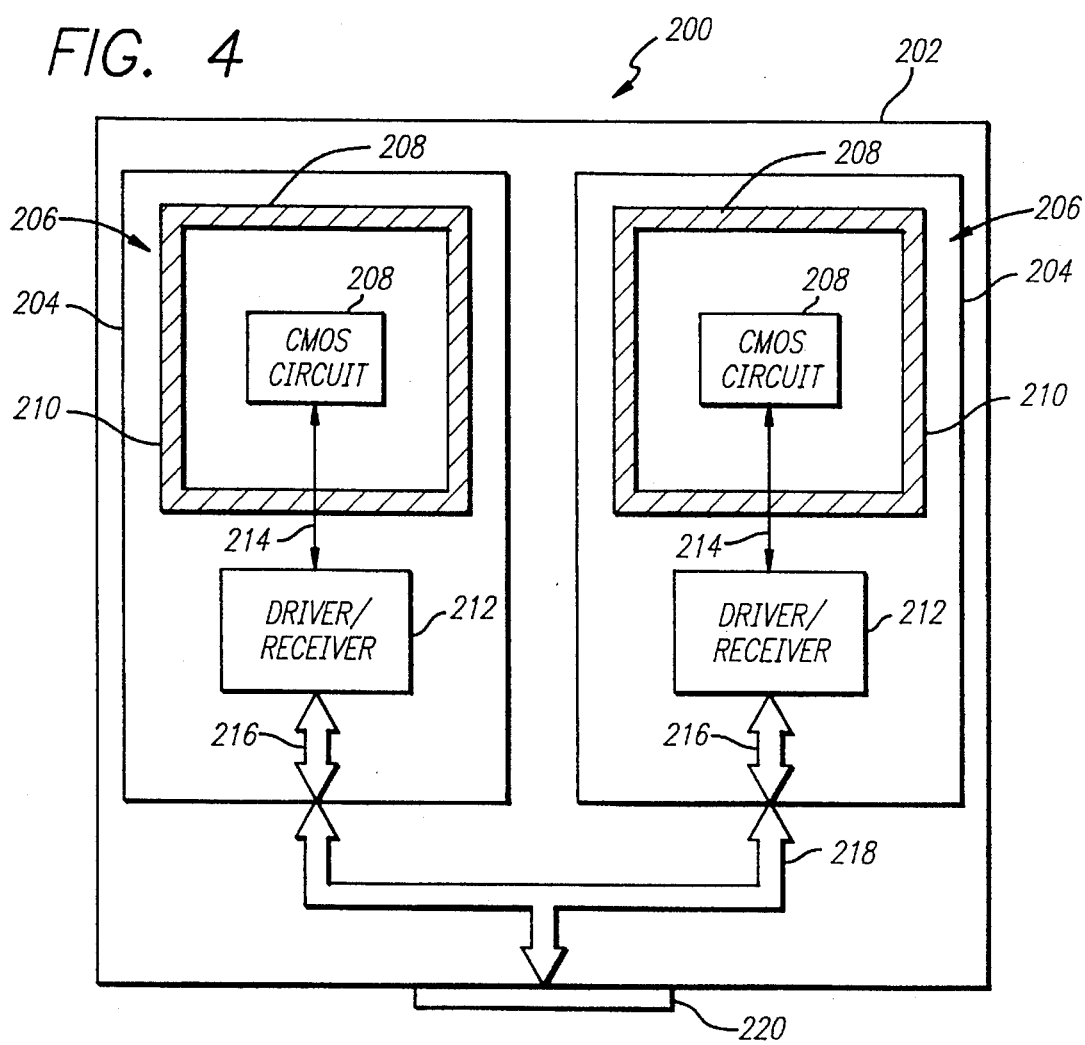
FIG. 4 is a diagram illustrating a Multi-Chip-Module (MCM) incorporating the present backplane driver/receivers.

An MCM 200 embodying the present invention is illustrated in FIG. 4, and comprises a multi-level substrate 202 as described above. A plurality of integrated circuit chips 204 are mounted on and interconnected with the conductors on the substrate 202. Each chip 204 includes a semiconductor substrate 206 on which is formed a CMOS circuit 208 which is surrounded by a guard ring 210 as described above with reference to FIG. 3.

A driver/receiver 212 is formed on each substrate 206 and connected to the respective CMOS circuit 208 by signal lines 214. Each driver/receiver 212 is also connected to a terminated backplane bus line 216 which is interconnected with a backplane bus line 218 formed on the MCM substrate 202. A connector 220 is provided for connection of the MCM 200 to external devices.

Figure 5:
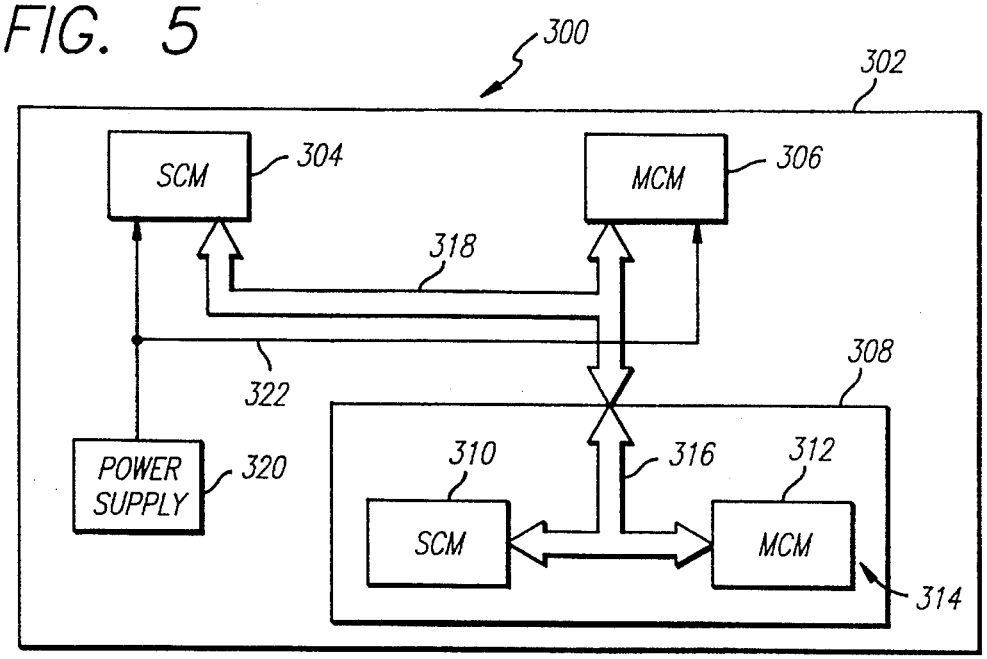
FIG. 5 is a diagram illustrating a Board-Level-Product (BLP) incorporating the present backplane driver/receivers.

FIG. 5 illustrates a Board-Level-Product (BLP) 300 embodying the present invention. The BPL 300 comprises a Printed Circuit Board (PCB) 302 or other type of circuit board on which are mounted an SCM 304 such as described with reference to FIG. 3, an MCM 306 such as described with reference to FIG. 4, and a hybrid module 308 which includes an SCM 310 and an MCM 312 on a substrate 314.

Although the invention is not limited to any particular configuration, the SCM 304, MCM 306 and hybrid module 308 can be provided with male connectors which fit into conjugate female connectors on the PCB 302 (not shown). The SCM 310 and MCM 312 are typically interconnected by a backplane bus 316 formed on the substrate 314, whereas the SCM 304, MCM 306 and hybrid module 308 are interconnected by a backplane bus 318 formed on the PCB 302.

The BPL 300 can further comprise a power supply 320 which is mounted on the PCB 302 for supplying power to the SCM 302, MCM 306 and hybrid module 308 via a power bus 322. The BPL 300 can yet further be provided with a casing and suitable control switches and displays as a complete box level product which a customer can use as an off-the-shelf item.

Each system level application of the present invention utilizes a plurality of backplane driver/receivers, each of which includes a backplane driver circuit 30 and a backplane receiver circuit 50 for interfacing CMOS cells or circuits to a terminated backplane data transmission bus line.

Figure 6:
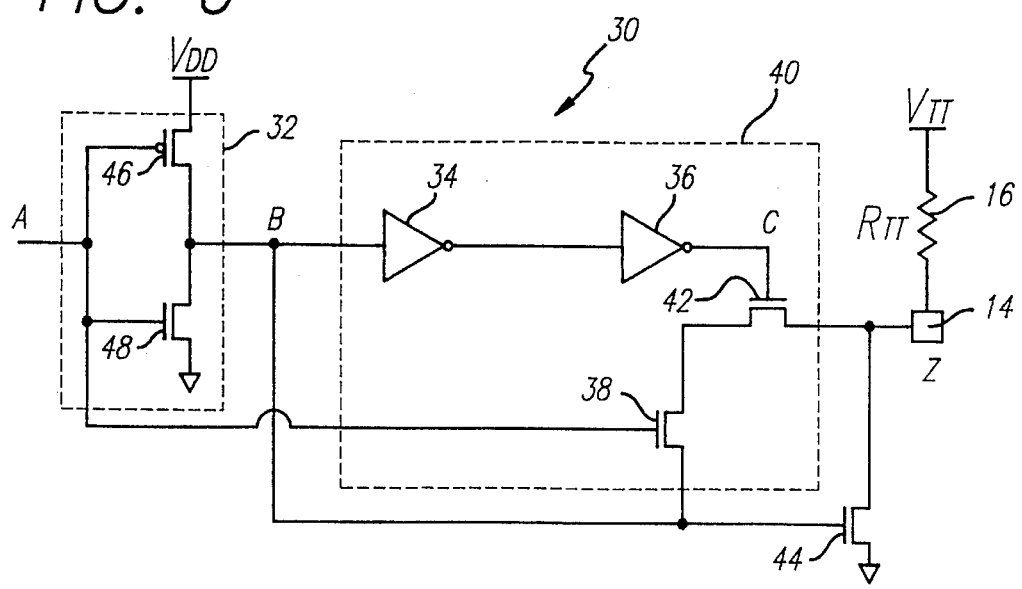
FIG. 6 is a schematic diagram of a backplane driver of the present backplane driver/receiver.
Figure 7:
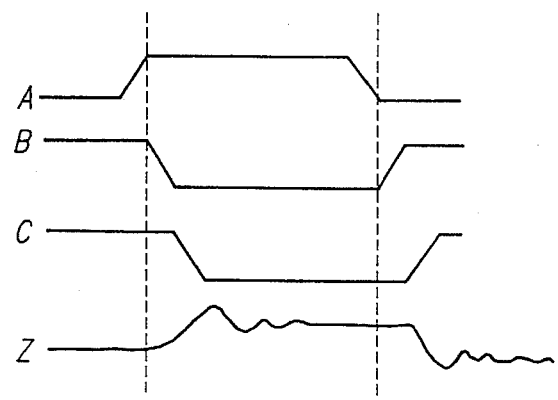
FIG. 7 is a logic timeline graph showing the logic level changes for nodes A, B, C, and Z during a transition from low-to-high and high-to-low input logic signal for the driver of FIG. 6.

The backplane driver 30 of the present invention is illustrated in FIG. 6, and will be assumed to be connected to the bus or transmission line 14 of FIG. 2. The circuit 30 receives an input signal A from one of the internal components of a CMOS circuit as described above with reference to FIGS. 2 to 5. The input signal A can be either a low or a high logic level.

The input signal A is first inputted into an invertor 32, which comprises a first inverting transistor 46 and a second inverting transistor 48. If the input signal is at a high logic state, the transistor 48 will conduct, pulling the signal at node B to ground, or a low logic level. Conversely, if the input signal A is low, then the transistor 46 conducts, conducting power rail $V_{DD}$ to node B, bringing node B to a high logic level.

Node B is connected to the gate of an output transistor 44. A high logic level at node B causes the transistor 44 to conduct, and a low logic level at node B shuts off the transistor 44. With the transistor 44 in a conducting state, it shunts the transmission line 14 to ground, or to a low logic level. With the transistor 44 shut off, the voltage level at the transmission line 14 will float to the level of $V_{TT}$, or a high logic level.

A feedback control circuit 40 activates during the transition from a low logic level at input A to a high logic level. The control circuit 40 comprises a first control loop invertor 34, a second control loop invertor 36, a first control loop transistor 38, and a second control loop transistor 42. An input signal from node B is provided to the control loop inverter 34 and 36 which are connected in series, such that the signal from node B is inverted twice or back to its initial logic state.

The resulting signal at node C is connected to the gate of the second control loop transistor 42. Input signal A is also connected to the gate of the first control loop transistor 38, with the drain of the first transistor 38 connected to the source of the second transistor 42. The drain of the second transistor 42 is connected to the transmission line 14. The source of the first control loop transistor 38 is connected to the node B.

During steady state conditions when the input at node A remains constant, the logic level at node C is the same as that at node B. When input signal at node A is a logic low, node B is high, and the output z provided to the transmission line 14 is low. Transistor 38 is shut off, but the transistors 42 and 44 are conducting. As the input signal switches from low to high, the first transistor 38 starts to conduct.

Upon reaching the threshold of the invertor 32, node B starts to go low and the output transistor 44 starts to turn off. The signal on the transmission line 14 begins pulling up to the high level corresponding with external voltage source $V_{TT}$. However, the rate of increase of the voltage level on the transmission line 14 is slowed due to the "on" state of both transistors 38 and 42 while the transistor 44 is turning off gradually.

The slow rise time at the transmission line 14 minimizes the noise at the output. After a short period of time which is controlled by the delay induced by the invertors 34 and 36, the transistor 42 begins to shut off. FIG. 7 shows the change of state at nodes A, B, and C, and graphically demonstrates the effect of the delay provided by the invertors.

Once the transistor 42 has stopped conducting, the feedback path is shut down and the circuit is in normal operation. The transition of the output signal on the transmission line 14 is depicted graphically as line Z in FIG. 7. As is apparent from the drawing, the ringing of the output signal quickly damps out due to the effect of the feedback control loop.

With the output transistor 44 effectively shut off, the voltage level on transmission line 14 will rise to the external transmission line voltage $V_T$. However, without the transistor 44 in a conductive state, the voltage level applied at the transmission line 14 is determined by the ratio of the source-drain resistance of the transistor 44 to the sum of that resistance plus the effective resistance of the parallel terminating resistors 16 and 16'.

With a transmission line voltage of 1.2 volts, and the termination resistor 16 of 20 ohms, a low logic level signal on transmission line 14 would be approximately 0.4 volts. Therefore, the backplane driver 10 of the present invention produces a voltage swing between 1.2 and 0.4 volts.

To implement the backplane driver 30 in a typical CMOS integrated circuit, the driver circuit 30 (as well as the receiver circuit 50) are preferably physically isolated from the internal components of the CMOS circuit.

As commonly known in the art, CMOS components are highly susceptible to damage by current spikes, also known as "latchup." Under certain conditions in which P-channel and N-channel CMOS transistors are placed close together, abnormally high amounts of current can flow from $V_{DD}$ to ground through a transistor, causing the transistor to overheat.

To address this problem, most CMOS circuits are provided with guard rings. The internal logic components of the CMOS circuit are provided within the guard rings, and the driver circuit 30, which communicates with the transmission line 14, is provided outside the guard rings as illustrated in FIGS. 3 and 4. Although the schematic of the backplane driver 30 is not changed, the driver may not adequately function without this physical placement.

Figure 8:
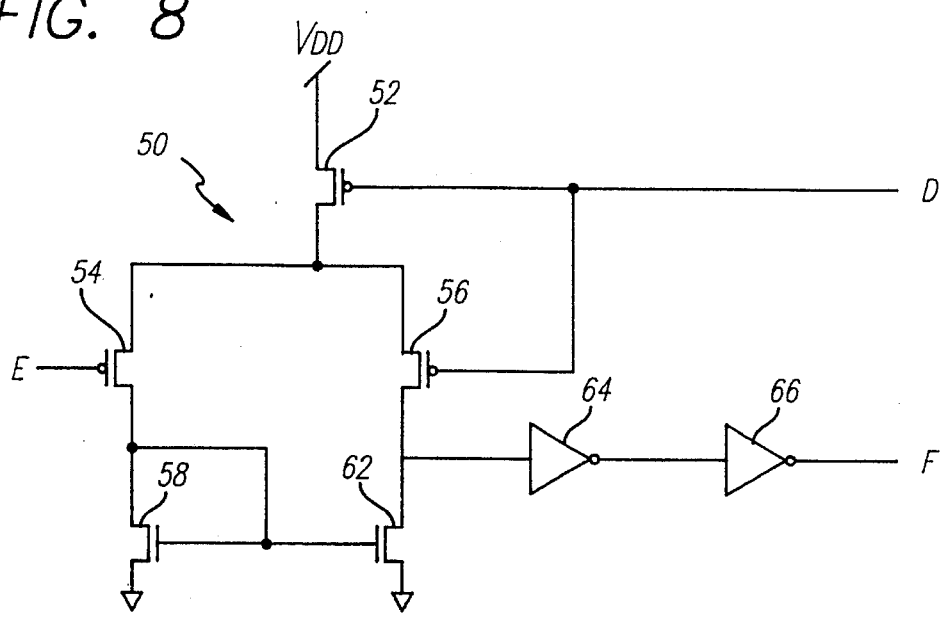
FIG. 8 is a schematic drawing of a receiver of the present driver/receiver.

The backplane receiver circuit 50 is illustrated in FIG. 8, and will also be assumed to be connected to the bus or transmission line 14. The circuit 50 acts as a level translator, to convert the logic signal produced by backplane driver 30 to the 5 volt voltage swing required to interface with internal CMOS components.

The backplane receiver circuit 50 comprises a differential circuit which compares an input signal D received from the transmission line 14 to a reference voltage E. Reference voltage E is applied to the gate of a first left side differential transistor 54. It is anticipated that the reference voltage E be equal to 0.8 volts, which is the average of the voltage swing produced by the driver circuit 30.

Input signal D from the transmission line 14 is applied to the gates of both an input transistor 52 and the first right side differential transistor 56. Each of the input transistor 52, the first left side differential transistor 54, and the first right side differential transistor 56 are of the P-channel type.

The drain of the first left side differential transistor 54 is connected to both the drain and the gate of a second left side differential transistor 58 and the gate of a second right side differential transistor 62. The source of the first left side differential transistor 54 is connected to both the source of the first right side differential transistor 56 and the drain of the input transistor 52.

The sources of both the second left side differential transistor 58 and the second right side differential transistors 62 are connected to ground. The drain of the first right side differential transistor 56 is connected to the drain of the second right side differential transistor 62, and to a pair of inverter 64 and 66 connected in series. Output F from the second invertor 66 corresponds with the inverted logic state of input signal D received from the transmission line 14.

With input D at the low logic level from the transmission line 14, corresponding with approximately 0.4 volts, both the transistors 52 and 56 will be conducting at a moderate level. In contrast, the transistor 54 will be conducting at a much lower level, since the reference voltage at node E is greater than that at input D. The current flowing through the input transistor 52 is split, with a smaller percentage flowing through the first left side differential transistor 54 than through the first right side differential transistor 56.

Since the input provided to the gates of both the transistor 58 and the transistor 62 is relatively low, each of the transistors above would be in a relatively low conducting state. Therefore, the signal at the drain of transistor 62 will be pulled towards a higher voltage, resulting in a high logic signal at output F. Conversely, if the input signal D is high, its voltage will be greater than that of the reference E, resulting in the transistors 62 and 58 turning on, and a low logic signal appearing at output F.

Thus, it is apparent that when the input at D is lower than the reference at E, a logic "1" appears at output F, and when the input D is greater than the reference at E, an output of logic "0" appears at output F.

It should be apparent to those skilled in the art that the circuits 12 could be equipped with backplane drivers 30 for transmit only operation, receivers 50 for receive only operation, or both drivers and receivers for two way communication with the bus.

Having thus described several preferred embodiments of system level applications including high performance backplane driver circuits, it should now be apparent to those skilled in the art that the aforestated objects and advantages for the within system have been achieved.

It will also be appreciated by those skilled in the art that various modifications, adaptations, and alternative embodiments thereof may be made within the scope and spirit of the present invention. Accordingly, the invention is defined by the following claims.

We claim:

1. An electronic device, comprising:

a substrate;

a CMOS circuit formed on the substrate;

a terminated bus line for signal transmission formed on the substrate;

a driver/receiver circuit formed on the substrate spaced from the CMOS circuit; and a guard ring formed on the substrate around at least a part of the CMOS circuit which faces the driver/receiver circuit;

the driver/receiver circuit comprising:

a driver for receiving an input logic signal from the CMOS circuit and inducing a corresponding signal onto the bus line; and a receiver for receiving an output signal from the bus line and providing a corresponding output logic signal to the CMOS circuit, the receiver comprising;

a receiver transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path.

2. The electronic device of claim 1, wherein the comparing means further comprises:

a first reference side differential transistor having a gate electrically connected to the reference signal, and a source electrically connected to a drain of the receiver transistor;

a second reference side differential transistor having a gate and a drain both electrically connected to a drain of the first reference side differential transistor, and a source electrically connected to ground;

a first signal side differential transistor having a gate electrically connected to the bus line, a source electrically connected to the receiver transistor drain, and a drain electrically connected to the output means; and a second signal side differential transistor having a gate electrically connected to the second reference side differential transistor gate, a drain electrically connected to the first signal side differential transistor drain, and a source connected to ground.

3. The electronic device of claim 2, wherein the output means further comprises:

a first output inverter having an input electrically connected to the first signal side differential transistor drain; and a second output inverter having an input electrically connected to an output of the first output inverter, an output of the second output inverter providing the CMOS logic signal.

4. The electronic device of claim 1, wherein the driver comprises:

a pre-driver inverter to invert a logic state of the input logic signal;

a driver transistor providing the corresponding signal;

a control means for controlling the corresponding signal during a transition of the input signal from a first logic state to a second logic state;

a receiver transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path.

5. The electronic device of claim 4, wherein the pre-driver inverter has an input and an output, and the driver transistor has a gate electrically connected to the predriver inverter output, a source electrically connected to ground and a drain electrically connected to the bus line.

6. The electronic device of claim 5, wherein the control means further comprises:

a first control inverter having an input electrically connected to the predriver inverter output;

a second control inverter having an input electrically connected to the first control inverter output, the first and second control inverters providing a time delay;

a first control transistor having a gate electrically connected to the input logic signal, a source electrically connected to the predriver inverter output, and a drain; and a second control transistor having a gate electrically connected to an output of the second control inverter, a source electrically connected to the first control transistor drain, and a drain electrically connected to the output transistor drain; whereby the first control transistor is driven to conduction by the input signal before the output transistor begins to shut off, and the second control transistor begins to shut off after the time delay.

7. An integrated circuit, comprising:

a substrate;

a CMOS circuit formed on the substrate;

a terminated bus line for signal transmission formed on the substrate; and a driver/receiver circuit formed on the substrate, the driver/receiver circuit comprising;

a driver for receiving an input logic signal from the CMOS circuit and inducing a corresponding signal onto the bus line; and a receiver for receiving an output signal from the bus line and providing a corresponding output logic signal to the CMOS circuit, the receiver comprising;

a receiver transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path.

8. The integrated circuit of claim 7, wherein the comparing means further comprises:

a first reference side differential transistor having a gate electrically connected to the reference signal, and a source electrically connected to a drain of the receiver transistor;

a second reference side differential transistor having a gate and a drain both electrically connected to a drain of the first reference side differential transistor, and a source electrically connected to ground;

a first signal side differential transistor having a gate electrically connected to the bus line, a source electrically connected to the receiver transistor drain, and a drain electrically connected to the output means; and a second signal side differential transistor having a gate electrically connected to the second reference side differential transistor gate, a drain electrically connected to the first signal side differential transistor drain, and a source connected to ground.

9. The integrated circuit of claim 8, wherein the output means further comprises:

a first output inverter having an input electrically connected to the first signal side differential transistor drain; and a second output inverter having an input electrically connected to an output of the first output inverter, an output of the second output inverter providing the CMOS logic signal.

10. The integrated circuit of claim 7, wherein:

the CMOS circuit is spaced from the driver/receiver on the substrate; and the integrated circuit further comprises a guard ring formed on the substrate around at least a part of the CMOS circuit which faces the driver/receiver circuit.

11. The integrated circuit of claim 10, wherein the guard ring comprises impurity doping.

12. A multi-chip module, comprising:

a substrate;

a plurality of integrated circuit modules mounted on the substrate, at least one integrated circuit module including:

a CMOS circuit;

a terminated bus line for signal transmission; and a driver/receiver circuit, including:

a driver for receiving an input logic signal from the CMOS circuit and inducing a corresponding signal onto the bus line; and a receiver for receiving an output signal from the bus line and providing a corresponding output logic signal to the CMOS circuit, including:

a receiver transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path; and interconnects formed on the substrate for interconnecting the driver/receiver circuits of the integrated circuit modules.

13. The multi-chip module of claim 12, wherein the comparing means further comprises:

a first reference side differential transistor having a gate electrically connected to the reference signal, and a source electrically connected to a drain of the receiver transistor;

a second reference side differential transistor having a gate and a drain both electrically connected to a drain of the first reference side differential transistor, and a source electrically connected to ground;

a first signal side differential transistor having a gate electrically connected to the bus line, a source electrically connected to the receiver transistor drain, and a drain electrically connected to the output means; and a second signal side differential transistor having a gate electrically connected to the second reference side differential transistor gate, a drain electrically connected to the first signal side differential transistor drain, and a source connected to ground.

14. The multi-chip module of claim 13, wherein the output means further comprises:

a first output inverter having an input electrically connected to the first signal side differential transistor drain; and a second output inverter having an input electrically connected to an output of the first output inverter, an output of the second output inverter providing the CMOS logic signal.

15. The multi-chip module of claim 12, wherein:

the CMOS circuit is spaced from the driver/receiver; and the integrated circuit module further comprises a guard ring formed around at least a part of the CMOS circuit which faces the driver/receiver circuit.

16. The multi-chip module of claim 15, wherein the guard ring comprises impurity doping.

17. An electronic board system, comprising:

a printed circuit board;

a plurality of integrated circuit modules mounted on the printed circuit board, at least one integrated circuit module including:

a CMOS circuit;

a terminated bus line for signal transmission; and a driver/receiver circuit, including:

a driver for receiving an input logic signal from the CMOS circuit and inducing a corresponding signal onto the bus line; and a receiver for receiving an output signal from the bus line and providing a corresponding output logic signal to the CMOS circuit, the receiver including:

a receiver transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path; and interconnects formed on the printed circuit board for interconnecting the driver/receiver circuits of the integrated circuit modules.

18. The electronic board system of claim 17, wherein the comparing means further comprises:

a first reference side differential transistor having a gate electrically connected to the reference signal, and a source electrically connected to a drain of the receiver transistor;

a second reference side differential transistor having a gate and a drain both electrically connected to a drain of the first reference side differential transistor, and a source electrically connected to ground;

a first signal side differential transistor having a gate electrically connected to the bus line, a source electrically connected to the receiver transistor drain, and a drain electrically connected to the output means; and a second signal side differential transistor having a gate electrically connected to the second reference side differential transistor gate, a drain electrically connected to the first signal side differential transistor drain, and a source connected to ground.

19. The electronic board system of claim 18, wherein the output means further comprises:

a first output inverter having an input electrically connected to the first signal side differential transistor drain; and a second output inverter having an input electrically connected to an output of the first output inverter, an output of the second output inverter providing the CMOS logic signal.

20. The electronic board system of claim 17, wherein:

the CMOS circuit is spaced from the driver/receiver; and the integrated circuit module further comprises a guard ring formed around at least a part of the CMOS circuit which faces the driver/receiver circuit.

21. The electronic board system of claim 20, wherein the guard ring comprises impurity doping.

22. The electronic board system of claim 17, further comprising a power supply mounted on the printed circuit board for supplying electrical power to the integrated circuit modules.

* * * * *